United States Patent
Heinrich et al.

(10) Patent No.: US 8,182,709 B2
(45) Date of Patent: May 22, 2012

(54) CMP SYSTEM AND METHOD USING INDIVIDUALLY CONTROLLED TEMPERATURE ZONES

(75) Inventors: Jens Heinrich, Wachau (DE); Gerd Marxsen, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 1022 days.

(21) Appl. No.: 12/132,850

(22) Filed: Jun. 4, 2008

(65) Prior Publication Data

US 2009/0170320 A1     Jul. 2, 2009

(30) Foreign Application Priority Data

Dec. 31, 2007   (DE) .................. 10 2007 063 232

(51) Int. Cl.
*B44C 1/22*   (2006.01)
*C03C 15/00*  (2006.01)

(52) U.S. Cl. ........... 216/84; 216/88; 216/89; 438/692; 438/693; 451/7; 451/33; 451/41

(58) Field of Classification Search .......... 216/88, 216/89, 84; 438/692, 693; 451/7, 33, 41
See application file for complete search history.

(56) References Cited

U.S. PATENT DOCUMENTS

| | | | |
|---|---|---|---|
| 5,873,769 A | 2/1999 | Chiou et al. | 451/7 |
| 6,000,997 A * | 12/1999 | Kao et al. | 451/7 |
| 2007/0205112 A1 * | 9/2007 | Kodera et al. | 205/641 |
| 2007/0289732 A1 * | 12/2007 | Pillion et al. | 165/289 |

FOREIGN PATENT DOCUMENTS

| | | |
|---|---|---|
| DE | 31 28 880 A1 | 7/1981 |
| DE | 197 48 020 A1 | 10/1997 |

OTHER PUBLICATIONS

Translation of Official Communication from German Patent Office for German Patent Application No. 10 2007 063 232.2 dated Aug. 8, 2008.

* cited by examiner

*Primary Examiner* — Shamim Ahmed
(74) *Attorney, Agent, or Firm* — Williams, Morgan & Amerson, P.C.

(57) ABSTRACT

By creating a temperature profile across a polishing pad, a respective temperature profile may be obtained in a substrate to be polished, which may result in a respective varying removal rate across the substrate for a chemically reactive slurry material or for an electro-chemically activated polishing process. Hence, highly sensitive materials, such as material comprising low-k dielectrics, may be efficiently polished with a high degree of controllability.

18 Claims, 9 Drawing Sheets

CMP SYSTEM AND METHOD USING INDIVIDUALLY CONTROLLED TEMPERATURE ZONES

BACKGROUND OF THE INVENTION

1. Field of the Invention

Generally, the subject matter disclosed herein relates to the field of manufacturing integrated circuits, and, more particularly, to a chemical mechanical polishing (CMP) process used for the formation of advanced microstructure devices, such as the metallization structures, including fragile dielectric materials.

2. Description of the Related Art

Typically, the fabrication of modern integrated circuits requires a large number of individual process steps, wherein a typical process sequence involves the deposition of conductive, semiconductive or insulating layers on an appropriate substrate. After deposition of the corresponding layer, device features are produced by patterning the corresponding layer with well-known means, such as photolithography and etching. As a consequence, by patterning a deposited layer, a certain topography will be created that also affects deposition and patterning of subsequent layers. Since sophisticated integrated circuits require the formation of a plurality of subsequent layers, it has become standard practice to periodically planarize the surface of the substrate to provide well-defined conditions for deposition and patterning of subsequent material layers. In other cases, any unwanted material may have to be removed, wherein typically used etch techniques may be less appropriate. This holds true especially for so-called metallization layers in which metal interconnects are formed to electrically connect the individual device features, such as transistors, capacitors, resistors and the like, to establish the functionality required by the circuit design.

In this situation, CMP has become a widely used process technique for removing unwanted material and reducing "imperfections" in the substrate topography caused by preceding processes in order to establish enhanced conditions for a subsequent process, such as photolithography and the like. The polishing process itself causes mechanical damage to the polished surface, however, in an extremely low range, i.e., at an atomic level, depending on the process conditions. CMP processes also have a plurality of side effects that have to be addressed so as to be applicable to processes required for forming sophisticated semiconductor devices.

For example, recently, the so-called damascene or inlaid technique has become a preferred method in forming metallization layers, wherein a dielectric layer is deposited and patterned to receive trenches and vias that are subsequently filled with an appropriate metal, such as aluminum, copper, copper alloys, silver, tungsten and the like. Since the process of providing the metal may be performed as a "blanket" deposition process based on, for instance, electrochemical deposition techniques, the respective pattern of the dielectric material may require a significant over-deposition in order to reliably fill narrow openings and wide regions or trenches in a common process. The excess metal is then removed and the resulting surface is planarized by performing a process sequence comprising one or more mechanical polishing processes, which also include a chemical component and/or an electrochemical component. Chemical mechanical polishing (CMP) has proven to be a reliable technique to remove the excess metal and planarize the resulting surface to leave behind metal trenches and vias that are electrically insulated from each other as required by the corresponding circuit layout. Chemical mechanical polishing or electrochemical mechanical polishing typically requires the substrate to be attached to a carrier, a so-called polishing head, such that the substrate surface to be planarized is exposed and may be placed against a polishing pad. The polishing head and polishing pad are moved relative to each other usually by individually moving the polishing head and the polishing pad. Typically, the head and the pad are rotated against each other while the relative motion is controlled to locally achieve a desired material removal. During the polishing operation, typically a slurry that may include a chemically reactive agent and possibly abrasive particles is supplied to the surface of the polishing pad.

Typically, the removal rate may be determined by process parameters, such as the relative speed of the surface to be polished and the polishing pad, the down force with which the substrate is pressed against the polishing pad, the type of slurry used and the mechanical characteristics of the polishing pad in combination with any abrasive particles. Generally, chemical mechanical polishing is a highly complex process, wherein, in addition to controlling the above-specified process parameters, the continuously varying state of the polishing pad may also have to be taken into consideration in order to obtain the desired process output. Moreover, with increasing diameter of the respective substrates, which may be 300 mm in advanced semiconductor facilities, the resulting profile after the polishing process may vary due to certain process fluctuations, such as spatially varying the state of the polishing pad, fluctuations during the slurry supply and the like. Consequently, sophisticated process control mechanisms have been established in an attempt to address the above-specified problems, wherein, for instance, the relative speed and the down force may be used as efficient parameters for controlling the polishing process. For example, in a typical polishing regime, a substantially linear dependence between the removal rate and the downward force and the substrate's linear velocity relative to the polishing pad may occur. Consequently, based on this process regime, the overall polishing rate may be controlled, wherein, by locally varying one of the above-identified parameters, a desired polishing profile across the substrate may be achieved. Hence, process inherent non-uniformities may be compensated for by appropriately adapting the local removal rate, and also any process non-uniformities of a preceding process step, for instance, the deposition of a specific material, may be taken account of by appropriately adapting the local removal rate during the CMP process. In order to locally adjust the removal rate, for instance, the down force may be appropriately adjusted, for instance, by providing respective pressure zones in the polishing head, which may result locally in a different effective down force, thereby, however, requiring a certain degree of mechanical stability of any materials located below the material layer under consideration.

With the advance of semiconductor technology, so-called low-k dielectric materials are increasingly used in combination with highly conductive metals, such as copper, in order to further enhance the overall performance of respective semiconductor devices. In this respect, low-k dielectric materials are to be understood as insulating materials having a relative permittivity of 3.0 and less, while, recently, even so-called ultra low-k dielectrics have been introduced with a dielectric constant of 2.5 and less. However, the reduced relative permittivity is typically associated with a reduced mechanical stability of the corresponding materials, thereby resulting in highly fragile dielectric layer stacks, from which excess material, such as copper, has to be removed, for instance, by CMP or electrochemical CMP. Due to the reduced mechanical stability of sophisticated dielectric materials, however, the down force during the polishing process may have to be increasingly reduced to an amount that is compatible with mechanical characteristics of the low-k dielectrics. This may, however, require, according to the above-specified linear dependency of the removal rate on the down force and the linear velocity, a respective increase of the speed of the relative motion between the polishing pad and the substrate. However, a respective increase of the relative motion may not necessarily translate into a higher removal rate in this polishing regime using extremely low down forces and, hence, in addition to a loss of process controllability, process efficiency may be reduced. Furthermore, other parameters such as the slurry flow and the like may be controlled in addition to the platen speed or the head speed, wherein, however, a highly complex mutual interaction of these parameters may require the development of highly complex process recipes, which may be difficult to be controlled in a feed forward or feedback regime, thereby contributing to reduced overall controllability and also to an increased probability of creating additional yield loss.

In view of this situation, it has been proposed to increase the global removal rate by using a slurry material having an enhanced chemical reaction rate, thereby reducing the contribution of the pure mechanical aspect of the polishing process while nevertheless containing a desired high removal rate. However, the process control may still be very complex and less efficient, since an enhanced chemical contribution to the overall removal rate may not efficiently "respond" to a variation of process conditions when controlling the complex substantially "mechanical contributions" represented by slurry supply and relative speeds of the platen and the substrate, in combination with a significantly reduced downward pressure.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to methods and a system for removing material from microstructure substrates, such as semiconductor devices, on the basis of a polishing process, in which a removal rate profile across the substrate may be adjusted on the basis of an appropriate temperature control, which may be highly efficient in combination with a chemically activated removal mechanism, as may be provided by a chemically highly reactive slurry material that typically exhibits a significant temperature dependency. In other cases, in electrochemical polishing processes, the redox potential may also exhibit a significant temperature dependency, thereby enabling a respective profiling of the removal rate across individual substrates. Consequently, efficient control strategies may be established on the basis of the temperature dependent removal mechanism, thereby improving controllability and enabling feedback and/or feed forward strategies, which may otherwise be difficult to achieve according to conventional control regimes.

One illustrative method disclosed herein relates to the polishing of a substrate, wherein the method comprises establishing a temperature profile in a material layer to be polished, wherein the temperature profile varies along at least one lateral direction of the material layer. The method further comprises polishing the material layer by using a temperature dependent chemical removal mechanism.

A further illustrative method disclosed herein comprises creating a temperature profile laterally across a polishing pad of a polishing tool. The method further comprises establishing a relative motion of the polishing pad and a substrate to each other, wherein the substrate comprises a material layer that is in contact with the polishing pad. Furthermore, the method comprises polishing at least a portion of the material layer by establishing a laterally varying removal rate in the material layer on the basis of the temperature profile and the relative motion.

One illustrative polishing tool disclosed herein comprises a polishing platen configured to receive a polishing pad and comprises a polishing head configured to receive a substrate having a surface to be polished. The polishing tool further comprises a drive assembly configured to establish a relative motion between the substrate and the polishing pad. Finally, the polishing tool comprises a temperature control system configured to create a temperature profile laterally varying across the surface when polishing the substrate.

BRIEF DESCRIPTION OF THE DRAWINGS

The disclosure may be understood by reference to the following description taken in conjunction with the accompanying drawings, in which like reference numerals identify like elements, and in which.

Figure 1A:
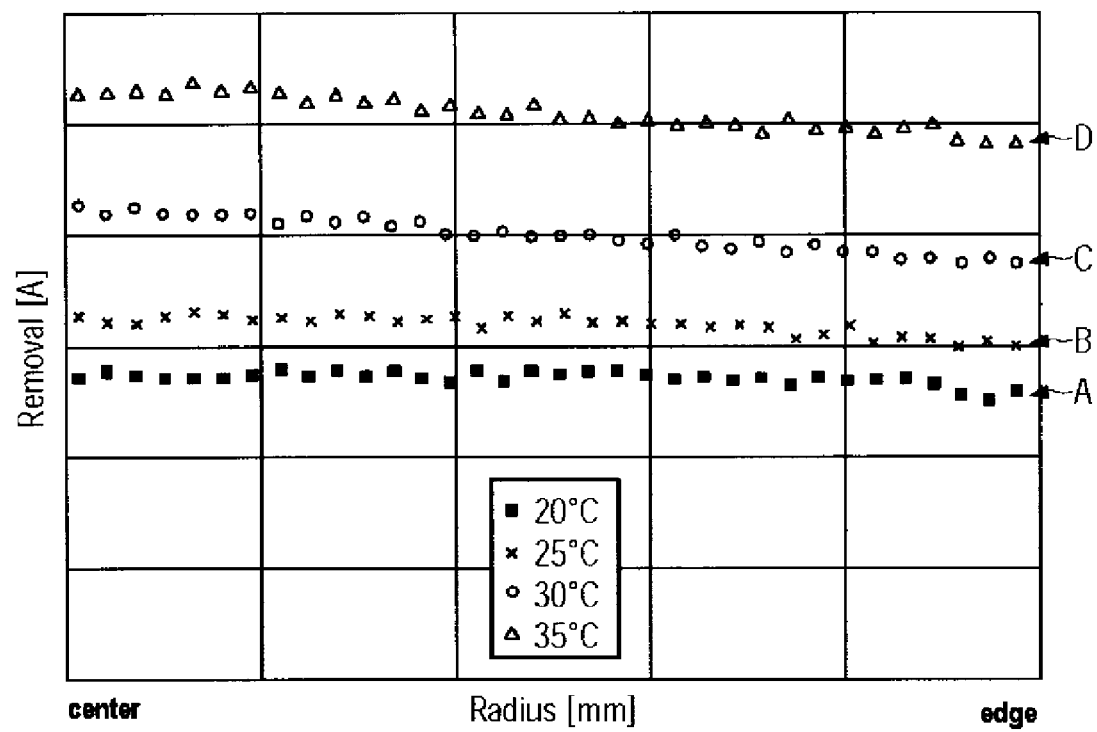
FIG. 1a schematically illustrates a graph depicting the temperature dependence of a chemically driven mechanism, for instance, in the form of a reaction rate of a chemically reactive slurry.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein generally addresses the issue of reduced controllability in sophisticated polishing processes, which may be performed on the basis of materials of reduced mechanical stability, so that well-established conventional chemical mechanical polishing (CMP) control strategies may result in a reduced responsiveness and increased process variability. For obtaining enhanced process efficiency and/or controllability, the temperature dependency of a chemically driven component of the polishing process may be used for adjusting a laterally varying removal rate during the polishing process of individual substrates. For instance, due to increasingly reduced down forces that may have to be applied during the polishing process involving sophisticated dielectric materials, such as low-k dielectric materials, the respective slurry materials may have to be provided in a form such that these slurry materials may exhibit a significant chemically reactive component, thereby resulting in a moderately strong temperature dependency. For example, the reaction rate of a corresponding slurry material may be determined by an exponential temperature dependence or may at least be dominated by a significant temperature dependence, wherein a certain mechanical dependency may also contribute to a certain degree. Consequently, by creating a specified temperature profile across the substrate to be polished, a corresponding varying removal rate may be achieved, thereby providing an efficient strategy for individually adjusting the removal rate and thus the finally obtained profile of the material layer to be polished. In some illustrative embodiments disclosed herein, the laterally varying removal rate may be obtained by establishing a respective temperature profile across the polishing platen, and thus across the polishing pad, which may result, when appropriately positioning the substrate to be polished, in a respective temperature profile in the substrate surface to be treated, which may therefore result in the desired removal behavior. In other illustrative embodiments, additionally or alternatively, a temperature profile varying across the substrate may be established by directly controlling the heat transfer to the substrate via the polishing head.

Consequently, an efficient control strategy may be established on the basis of the temperature dependent removal rate profile with the possibility of increasing the effect of a response to control activities, which may be established on the basis of measurement data, for instance, provided in the form of feedback measurement data and/or feed forward data. Hence, a control strategy may be accomplished in which the laterally varying removal rate may be adjusted on the basis of measurement data obtained from previously processed substrates or from incoming substrates to be processed. In this manner, process non-uniformities of a preceding process, such as a deposition process, may be efficiently compensated for, even for sophisticated CMP applications involving advanced metallization structures of semiconductor devices. On the other hand, CMP intrinsic local process non-uniformities may also be taken into consideration by inspecting previously processed substrates, since a change of the across-substrate profile may be significantly affected by the temperature dependent removal rate, thereby providing an efficient means for immediately responding to local process variations.

FIG. 1a schematically illustrates a graph illustrating the temperature dependence of a chemically reactive slurry material, as may be used for the removal of materials, such as copper, conductive barrier materials and the like, as are typically used for the fabrication of sophisticated metallization structures. As shown, the amount of removed material is plotted against various radial positions of a semiconductor wafer including a respective material such as copper. Moreover, substantially identical substrates have been processed on the basis of different temperatures in the range of 20-35° C. Curves A to D represent the respective results for the different temperatures, wherein it is evident that a significant temperature dependence of the removal rate may be obtained. Furthermore, it may be noted that a slight variation of the removal rate with the radial position may occur, for instance, in particular at higher temperatures, as is indicated by curves C and D, which may have a higher removal rate at the center. For example, the measurement data may be obtained on the basis of a conventional CMP strategy, i.e., by controlling parameter values, such as down force and the relative speed, which, however, do not represent appropriate control parameters due to the relatively low down forces that may have to be used in sophisticated CMP processes, as previously explained. It is to be noted, however, that the variation of the removal rate caused by a variation of temperature is significantly more pronounced compared to a respective variation of removal rate for a substantially constant temperature. Hence, even for a temperature range of 20-35° C., a local variation of the temperature may not only allow a compensation of the inherent removal rate variation, for example, the "center fast" behavior as indicated by curves C and D, but may enable an "over-compensation" of these process-inherent variations and, thus, a respective patterning or modulation of the across-substrate removal rate.

It should be appreciated that the behavior of the slurry as indicated by FIG. 1a may represent a chemical removal mechanism, that is, material may be removed on the basis of a significant chemical reaction, while also a certain mechanical component may still be present. In other cases, a chemical removal mechanism may be obtained by performing an electrochemical polishing process, in which, in addition to a respective slurry material, a voltage may be applied between the material to be removed and the slurry material or polishing platen, wherein the corresponding redox potential for the material to be polished may also be temperature dependent, thereby allowing a local variation of the redox potential by locally controlling the temperature profile, which may also result in a corresponding locally varying removal rate. In this case, curves A-D may then represent removal rates in an electrochemical CMP process.

Figure 1B:
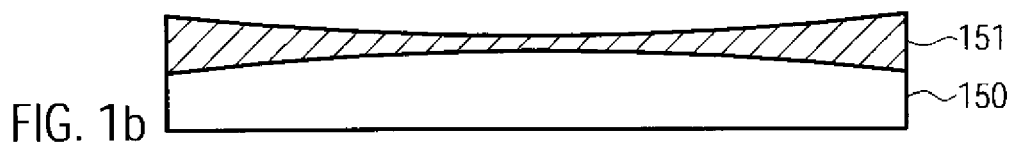
FIG. 1b schematically illustrates a substrate having formed thereon a material layer to be polished.

FIG. 1b schematically illustrates a cross-sectional view of a typical substrate 150, above which is formed a material layer 151, which may comprise a stack of different materials as is typically the case in complex semiconductor devices. In one illustrative embodiment, the material layer 151 may represent a metallization layer including a low-k dielectric material and a highly conductive metal, such as copper, copper alloy, tungsten and the like, which may have been formed on the basis of electrochemical deposition techniques and the like. Thus, during the formation of the material layer 151, complex deposition regimes may have to be used, for instance, reliably filling trenches and vias with lateral dimensions of 100 nm and less in combination with metal regions having significantly greater lateral dimensions, wherein a reliable bottom-to-top fill behavior may be required. Consequently, significant excess material may have to be deposited, which may finally result in a specific deposition profile, in particular, when electrochemical deposition techniques may be used. For example, as shown in FIG. 1b, the final deposition process for forming the material 151 may have resulted in a bowl-shaped profile with a reduced thickness at the center. When, for instance, a substantially uniform surface topography may be desired after removing a portion of the material layer 151, the CMP process to be performed should have a corresponding removal rate profile to compensate for the thickness variations of the material layer 151.

Figure 1C:
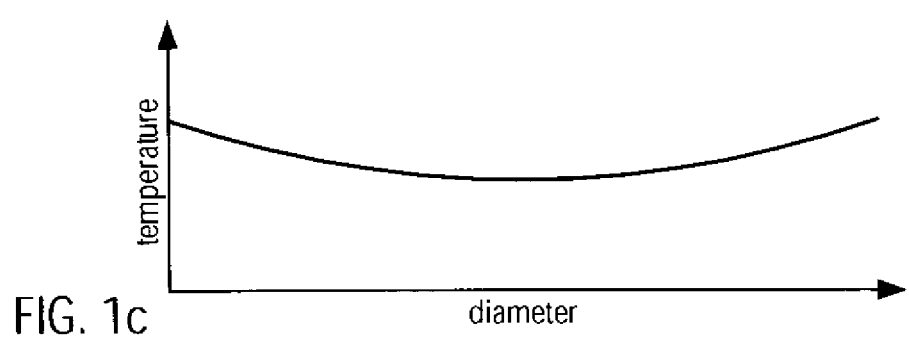
FIG. 1c schematically illustrates an appropriate temperature profile so as to obtain an increased removal rate at edges of the substrate, according to the illustrative embodiments.

FIG. 1c schematically illustrates a respective temperature profile that may be established, for instance, on the basis of respective measurement data, as qualitatively shown in FIG. 1a, which may result for a given slurry material and globally set process parameters in an increased removal rate at the edges of the substrate 150 compared to the center. FIG. 1c schematically illustrates a respective temperature profile, wherein it should be appreciated that the corresponding profile may be selected to compensate for the thickness non-uniformity of the layer 151, wherein any polishing-inherent non-uniformities, as may, for instance, be indicated by the curves A-D in FIG. 1a, may also be taken into consideration, if desired. That is, in some illustrative embodiments, an even further increased temperature may be established at the edges of the substrate 150 to account for the generally reduced removal rate of a polishing-inherent characteristic, as is, for instance, indicated by curves C-D in FIG. 1a.

Figure 1D:
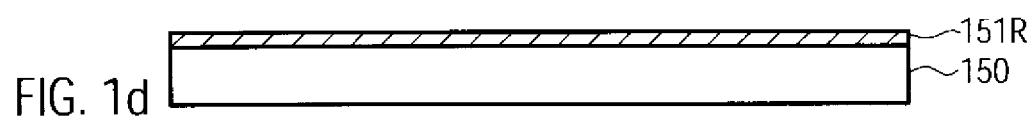
FIG. 1d schematically illustrates the substrate after performing a temperature-controlled polishing process, according to illustrative embodiments.

FIG. 1d schematically illustrates the substrate 150 after a CMP process, in which an appropriate temperature profile may be used, for instance, as indicated by FIG. 1c, thereby resulting in a reduced material layer 151R having a thickness with increased uniformity across the substrate 150. A respectively configured process tool and a strategy for operating the same will be described later on in more detail.

Figure 1E:
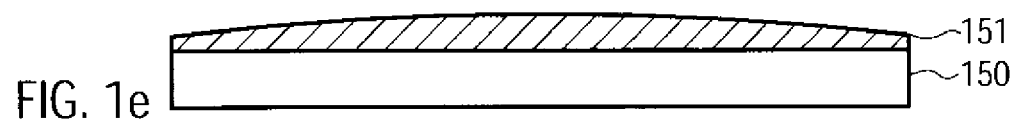
FIGS. 1e-1g schematically illustrate a substrate, a respective temperature profile and the substrate after performing a temperature controlled polishing process, according to still further illustrative embodiments.

FIG. 1e schematically illustrates a substrate 150 according to other illustrative embodiments, in which the previous process sequence may have resulted in a non-uniform thickness of the layer 151, thereby having an increased thickness at the center of the substrate 150.

Figure 1F:
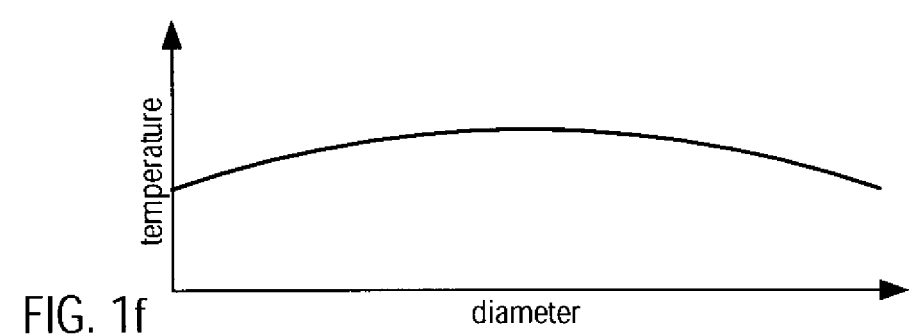

FIG. 1f schematically illustrates a respective temperature profile that may be established across the substrate 150 during the polishing process to obtain a substantially uniform layer thickness after the process. In this case, it should be appreciated that polishing-inherent non-uniformities may also be taken into account for the temperature profile by, for instance, reducing the temperature less than dictated by the initial thickness profile of the layer 151 due to an overall reduced removal rate at the edge of the substrate 150.

Figure 1G:
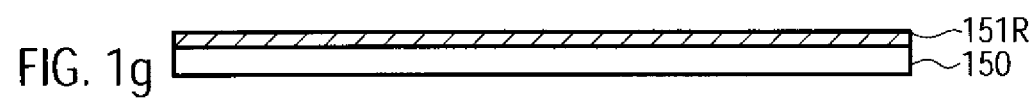

FIG. 1g schematically illustrates the substrate 150 having the reduced material layer 151R with a substantially uniform layer thickness.

It should be appreciated that any other temperature profiles may be established, depending on the process requirements. For instance, if a non-uniform thickness profile may be desired for the reduced material layer 151R, the temperature profile may be selected on the basis of the initial thickness profile of the layer 151 and on the basis of a final desired "patterned" thickness profile of the reduced layer 151R. In other cases, the layer 151 may have a more complex non-uniformity profile, which may act as a "template" for creating the corresponding temperature profile for processing the substrate 150. It should be appreciated that process-inherent non-uniformities, as best shown in FIG. 1a by considering curves C-D, may be "automatically" taken into consideration by obtaining profile data from substrates 150 having the reduced material layer 151R in that a target temperature profile may be established by comparing the profile of the layer 151R with a target profile.

Figure 2A:
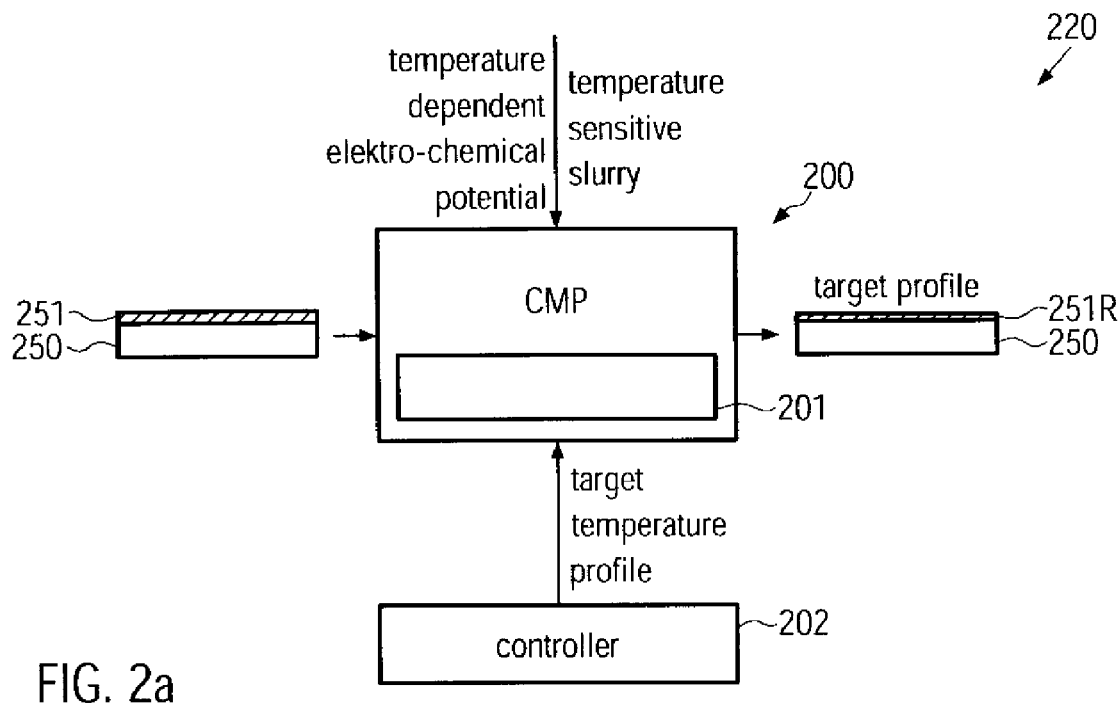
FIGS. 2a-2b schematically illustrate polishing tools including an appropriate temperature control unit for adjusting a laterally varying removal rate during a polishing process, according to still further illustrative embodiments.

FIG. 2a schematically illustrates a portion of a manufacturing environment 220, for instance, configured to process sophisticated semiconductor devices and the like, in which a CMP tool 200 may be provided. It should be appreciated that the CMP tool 200 may also include electrochemical polishing tools, as previously explained. The tool 200 may comprise an appropriate process chamber including a polishing platen and a polishing head, as will be explained in more detail later on, wherein at least one of these components may be operatively connected to a temperature adjustment unit 201. The temperature adjustment unit 201 may have appropriate components for establishing a desired laterally varying temperature profile or varying removal rate during the processing of substrates, wherein respective heat exchange media, electrically driven heating and cooling elements and the like may be provided in any appropriate configuration to allow a local adjustment of temperature on a substrate to be treated. Illustrative configurations of the temperature adjustment unit 201 will be described later on in more detail. Furthermore, the temperature adjustment unit 201 may be connected to a controller 202, which may be configured to control the unit 201 on the basis of a target temperature profile or a target removal profile, such as the illustrative profiles shown in FIGS. 1c and 1f. The controller 202 may be configured to determine the target temperature profile on the basis of externally supplied information, such as measurement data, and/or the controller 202 may have stored therein a plurality of predefined target temperature profiles or removal rate profiles, one of which may be selected in accordance with process requirements. Based on the target temperature or removal profile, one or more manipulated variables of the temperature adjustment unit 201 may be appropriately set by the controller 202 to obtain the desired profile during the actual processing.

During operation of the tool 200, a substrate 250 comprising a material layer 251 to be polished may arrive from any preceding manufacturing process in the environment 220 and may be polished on the basis of a global selected polishing recipe and the target temperature or removal profile stored and/or determined in the controller 202. Hence, after processing substrates 250 in the tool 200, the reduced layer 251R may have a thickness profile that is related to the target temperature profile or removal rate profile used by the controller 202.

Figure 2B:
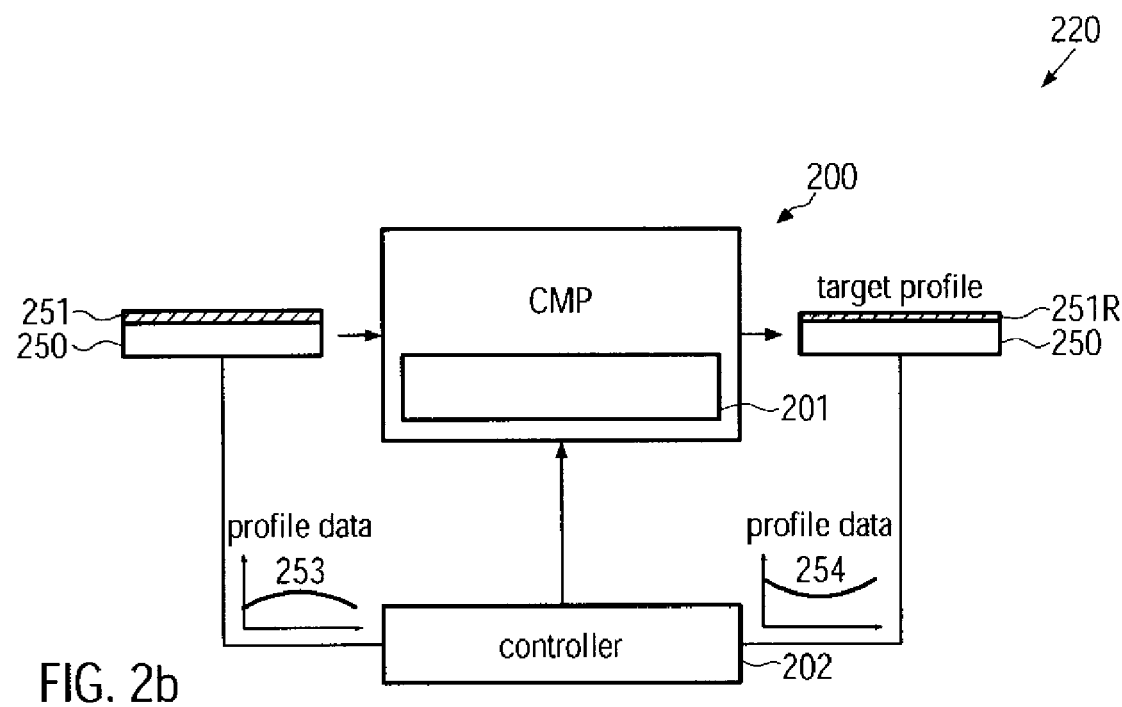

FIG. 2b schematically illustrates the manufacturing environment 220 including the tool 200 according to still further illustrative embodiments. As shown, the controller 202 may further be configured to be receive pre-polishing measurement data 253 from one or more substrates still to be processed in the tool 200, such as the substrate 250 comprising the material layer 251. The pre-polishing measurement data 253 may, for instance, represent thickness measurement data indicating an initial thickness profile of the layer 251 as is, for instance, explained with reference to FIGS. 1c and 1e. In other cases, any other appropriate measurement data or other data containing process information may be received by the controller so as to establish an appropriate target temperature profile for obtaining a desired process output. For example, as previously explained, when the measurement data 253 indicate a significant non-uniformity of the material layer 251 and a substantially uniform reduced layer thickness, as desired, the controller 202 may determine an appropriate target temperature profile by determining a local difference of the removal rates required to obtain the desired process output for an estimated total polishing time. The expected difference in the local removal rate may be obtained using appropriate information that describes the characteristics of the temperature dependent removal behavior, as is for instance qualitatively illustrated in FIG. 1a. In this manner, the initially created non-uniformity of the incoming substrates 250 may be compensated for. In other illustrative embodiments, additionally or alternatively to receiving the pre-polishing measurement data 253, the controller 202 may be configured to receive post-polishing measurement data 254, which may therefore contain information on the process output of previously processed substrates. For example, respective thickness profile data of the reduced layer 251R may be contained in the post-polishing measurement data 254. It should be appreciated that the data 254 may have "encoded" therein information about the initial thickness profile of the incoming substrates 250 and of process-inherent characteristics of the polishing process, since any fluctuations or shifts may be superimposed on the removal characteristics created by the temperature profile used for polishing the substrate. These fluctuations and shifts may, for example, be caused by tool-specific changes, such as wear of specific consumables and the like. Thus, in some specific embodiments, the measurement data 254 may be used for controlling the tool 200 so as to obtain the desired process result, when a respective delay in obtaining the post-polishing measurement data 254 may be acceptable. In other cases, both the pre-polishing data 253 and the post-polishing measurement data 254 may be used by the controller 202 to provide an updated target temperature profile, which may result in enhanced control efficiency. For example, upon comparing the initial measurement data 253 with the currently used target temperature profile, a polishing process inherent non-uniformity may be identified with increased efficiency, while also maintaining deviations from the desired target temperature profile of the reduced material layer 251R at a low level, since using the pre-polishing data 253 in selecting an appropriate target temperature profile may at least provide a certain degree of compensation for the initially present thickness variation of the layer 251, even if the post-polishing measurement data 254 are provided with a certain delay. Consequently, an efficient feed forward and/or feedback control strategy may be accomplished by using the local temperature at the substrate as a control variable.

Figure 2C:
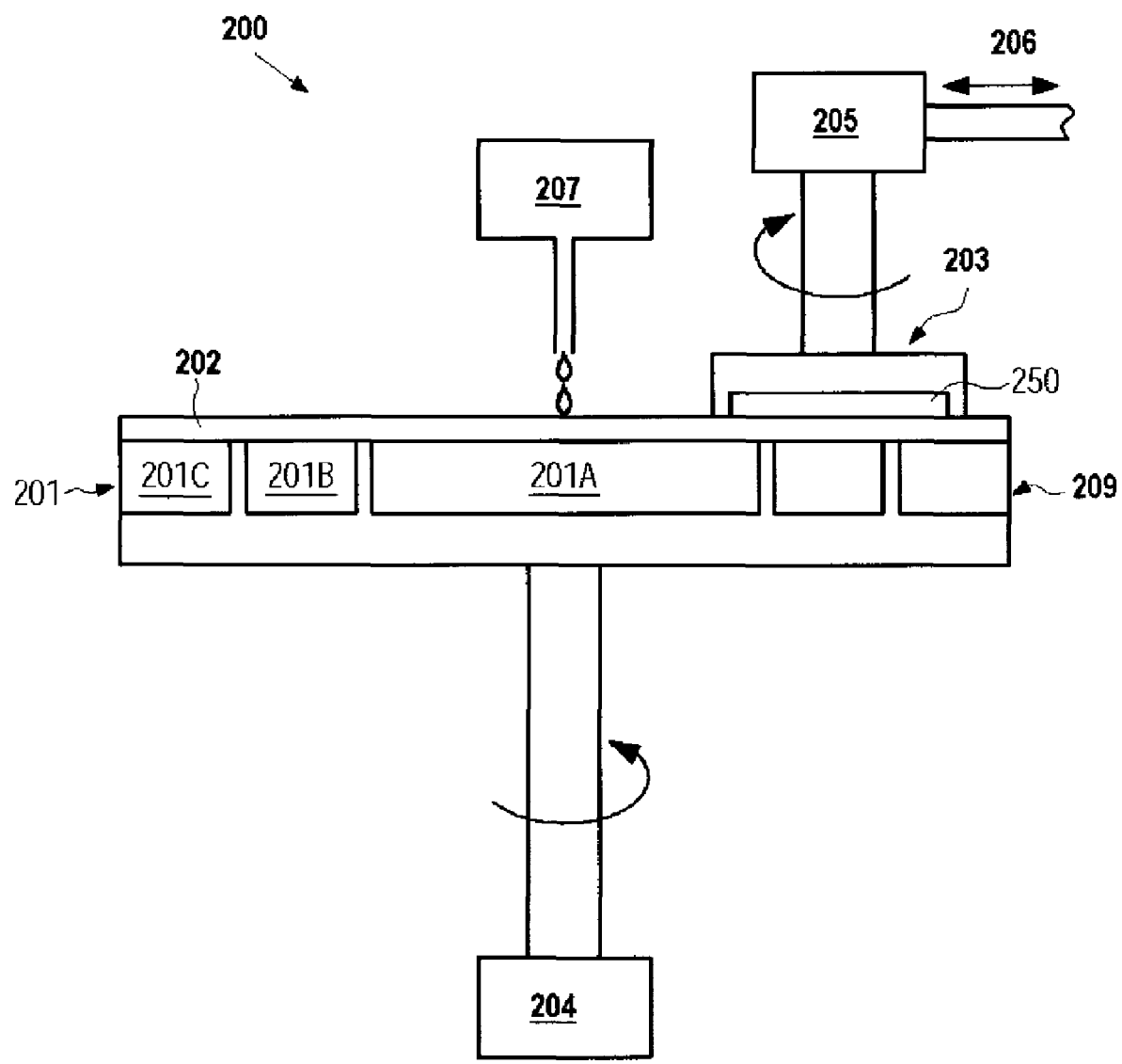
FIG. 2c schematically illustrates a cross-sectional view of a polishing tool, according to some illustrative embodiments.

FIG. 2c schematically illustrates a cross-sectional view of a portion of the CMP tool 200. As shown, the CMP tool 200 may comprise a polishing platen 209 that is rotatably attached to a drive assembly 204, which in turn is configured to move the polishing platen 209, wherein, in the embodiment shown, the drive assembly 204 may be configured to create a rotational motion of the platen 209, which is thus provided in a disk-like shape. Furthermore, a polishing head 203 may be provided and configured to receive a substrate, such as the substrate 250, and to position the substrate 250 above the polishing platen 209. Furthermore, the polishing head 203 may be connected to a drive assembly 205 so as to move the substrate 250 with respect to the polishing platen 209. For example, the drive assembly 205 may be configured to rotate the polishing head 203 with a controllable, rotational speed. Furthermore, the drive assembly 205, in combination with the polishing head 203, may enable adjusting a down force during operation of the tool 200 as previously described. Additionally, the drive assembly 205 or any other additional drive unit may be configured to provide a motion 206 of the polishing head 203, which enables the positioning of the substrate 250 at any appropriate position above the polishing platen 209. For example, in the embodiment shown, the motion 206 may include a component for radially positioning or "sweeping" the polishing head 203 across the polishing platen 209. The tool 200 may further comprise a slurry supply 207 configured to supply an appropriate slurry material, for instance, a chemically highly reactive slurry material, as previously explained, at any appropriate position on a polishing pad 202. Furthermore, the platen 209 may have incorporated therein the temperature adjustment unit 201 comprising a plurality of heat exchange units 201A, 201B, 201C in order to define corresponding temperature zones within the platen 209 and thus in the polishing pad 202. The temperature exchange units 201A, 201B, 201C may be provided in any size and configuration so as to divide the polishing platen 209, or at least a significant portion thereof, into respective temperature zones, which for convenience may also be referred to as temperature zones 201A, 201B, 201C. For instance, the units or zones 201A, 201B, 201C may be provided in one embodiment as substantially concentric ring-shaped units, wherein the central unit 201A may have a disk-like configuration. In other illustrative embodiments, a plurality of individual units may be provided, wherein respective sub-sets of these units may be operated at substantially the same temperature so as to define the respective temperature zones as desired. In still other illustrative embodiments, the polishing platen 209 may be provided in the form of a polishing table, in which the polishing pad 202 may be stationary or may be linearly movable so that the corresponding units 201A, 201B, 201C may be adapted in size and shape to appropriately define the respective desired temperature zones. The heat exchange units 201A, 201B, 201C may comprise any appropriate heat transfer medium, such as a liquid or generally any type of fluid at a specified temperature as is required for establishing a desired temperature profile across the polishing platen 209 and thus the polishing pad 202. Depending on the mechanical configuration of the polishing tool 200, respective heat transfer media, such as fluids and the like, may be supplied to the units 201A, 201B, 201C during appropriate operational states, for instance, by connecting the units 201A, 201B, 201C to respective external supply sources for the corresponding heat transfer media during an idle phase, while, in other illustrative embodiments, respective supply lines may be provided, which may also enable a supply of respective heat transfer media during operation of the polishing platen 209.

In still further illustrative embodiments, the heat exchange units 201A, 201B, 201C may comprise electrically operable heating and/or cooling elements, as will be described later in more detail. In other embodiments, a combination of electrically operable heating elements and cooling elements and appropriate heat transfer media may be provided in the polishing platen 209, wherein the electrically operable heating/cooling elements may be positioned at any appropriate locations, which may be remote to the actual temperature zones while an efficient distribution of heat may be accomplished on the basis of the respective heat transfer media, thereby establishing the temperature zones or units 201A, 201B, 201C. Since electrical energy may be efficiently supplied to the platen 209, even during operation of the tool 200, the desired temperature profile may be established with a high degree of uniformity during the operation of the polishing tool 200.

Figure 2D:
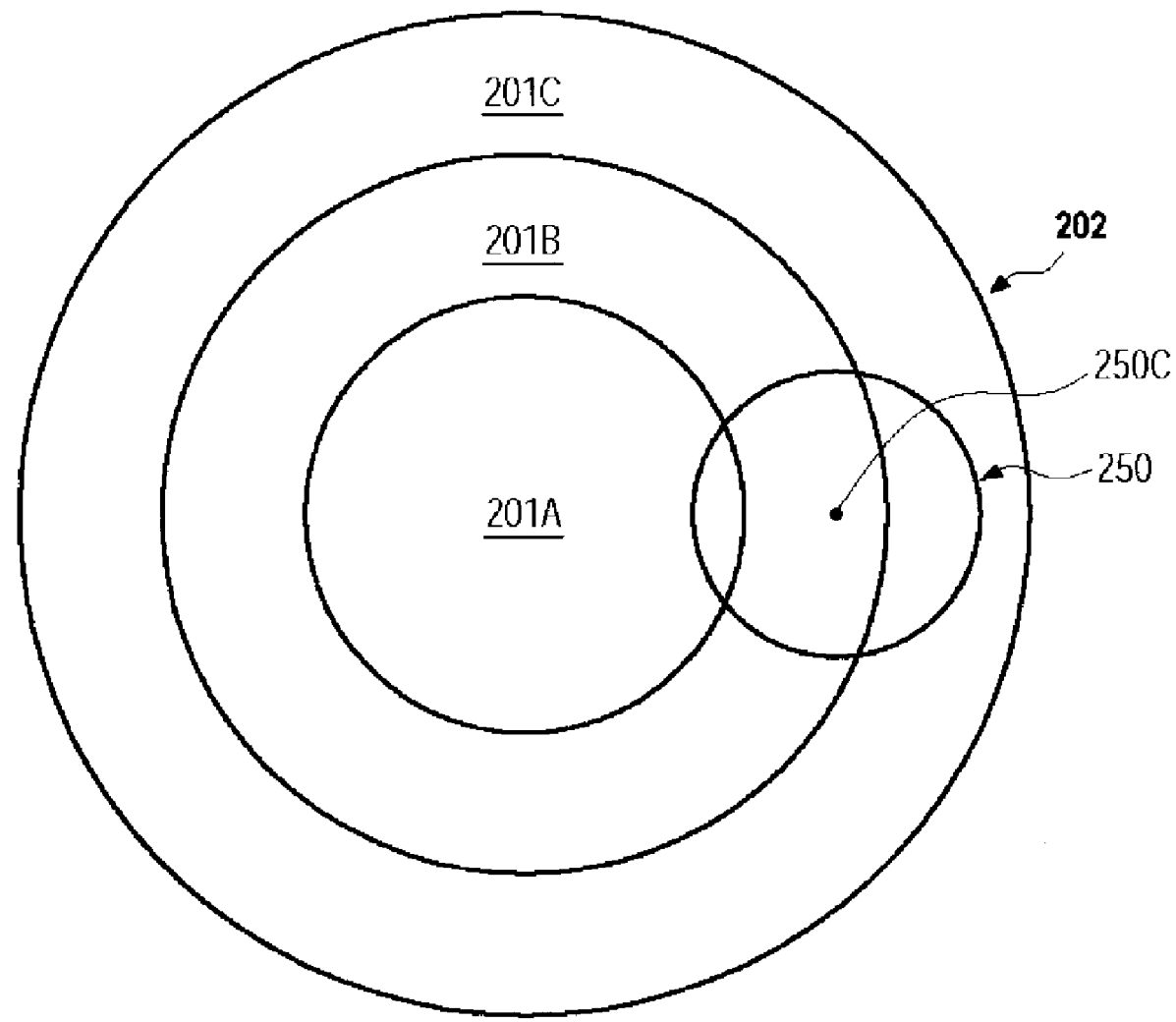
FIG. 2d schematically illustrates a top view of a polishing platen including a plurality of temperature zones in combination with a substrate to be polished, according to one illustrative embodiment.

FIG. 2d schematically illustrates a top view of the tool 200 in a simplified manner, wherein the polishing pad 202 is illustrated during operation, when the substrate 250 is appropriately positioned thereon on the basis of the polishing head 203 and the respective drive assembly 205. For convenience, these components are not shown in FIG. 2d. Moreover, upon activating the temperature adjustment unit 201, a predefined number of temperature zones, such as the zones 201A, 201B, 201C, may be created with an appropriate size and shape. The configuration of the temperature zones 201A, 201B, 201C may be defined in advance, for instance, on the basis of a desired target temperature profile to be established across the polishing pad 202 and any experimental and/or theoretical data that enables a prediction of the actually-obtained laterally varying temperature profile, depending on the respective parameters for establishing the temperature zones 201A, 201B, 201C. In the case of a predefined size and shape of the temperature zones 201A, 201B, 201C, the temperature thereof may, in some illustrative embodiments, be dynamically adapted to specific process conditions, if required, while, in other cases, the temperature of the respective zones may be individually maintained at a substantially constant level, depending on the heat exchange capabilities of respective heating and cooling elements defining the zones 201A, 201B, 201C. That is, although the respective zones 201A, 201B, 201C, at least within the polishing platen 209, may be thermally isolated from each other, for instance, by separating the respective units by an appropriate material of low thermal conductivity, a certain degree of heat exchange will occur via the polishing pad 202 so that, in some illustrative embodiments, the capacity of the units 201A, 201B, 201C, for instance in the form of heat capacity and the like, is appropriately designed so as to substantially compensate for the heat flow via the polishing pad 202. Thus, a substantially constant temperature may be maintained across significant portions of the temperature zones 201A, 201B, 201C, while a respective temperature gradient may exist in the boundary region between adjacent two temperature zones.

Hence, upon an initial definition of the size and configuration of the temperature zones 201A, 201B, 201C, the overall laterally varying temperature profile in the polishing pad 202 may be controlled, wherein, by appropriately adjusting or re-adjusting the individual temperatures in the zones 201A, 201B, 201C, a certain degree of dynamic temperature control functionality may be accomplished, depending on the thermal responsive behavior of the zones and the polishing pad. A respective re-adjustment of the temperatures may be accomplished, for instance, in idle phases of the tool 200, if a dynamic supply of respective heat transfer media may not be possible during operation of the tool 200, while, in other cases, as previously explained and as will also be discussed later on in more detail, an adjustment or re-adjustment may be performed in a highly dynamic manner, even during operation of the tool 200. In other illustrative embodiments, as will be described later on, the size and shape of the temperature zones 201A, 201B, 201C may also be dynamically adapted.

During operation of the polishing tool 200, the substrate 250 may be attached to the polishing head 203 and may be placed on the polishing pad 202, while also adjusting a desired relative velocity between the substrate 250 and the polishing pad 202. For example, the polishing platen 209 may be rotated with an appropriate rotational speed and also the polishing head 203 may be operated so as to rotate the substrate 250, while also controlling the down force, as previously explained, wherein, in some illustrative embodiments, a very low down force may be used, when mechanically sensitive material layers, for instance, comprising a layer stack including low-k dielectric materials, are to be polished. Upon contact of the substrate 250 with the polishing pad 202 including the different temperature zones 201A, 201B, 201C, the temperature of the surface to be polished may also develop a certain laterally varying temperature profile, depending on the size of the temperature zones, the respective temperatures thereof and the positioning of the substrate relative to the various temperature zones. Thus, in the embodiment shown, the radial position of the substrate 250 may also represent an efficient process parameter for controlling the finally established temperature profile across the substrate 250. Therefore, the slurry material having a highly temperature dependent reaction rate, as previously explained, may chemically interact with the surface to be polished, wherein the removal rate may then also vary depending on the temperature profile established. For example, in the embodiment shown, the substrate 250 may be positioned such that a center 250C thereof is positioned in the temperature zone 201B, while peripheral areas of the substrate 250 may periodically come into contact with the temperature zones 201A, 201C upon rotation of the substrate 250. If, for instance, a temperature profile is desired in which temperature in the center 250C may be higher compared to the peripheral areas of the substrate 250, the temperature of the zone 201B may be adjusted to a appropriately selected high value, while the temperatures in the zones 201A, 201C may be maintained at a lower level.

Figure 3A:
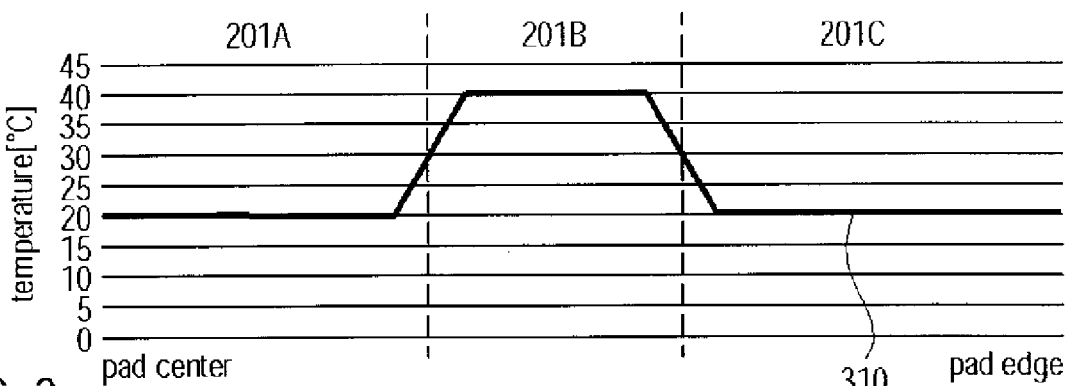
FIGS. 3a-3b schematically illustrate a laterally varying temperature profile on a polishing platen and a correspondingly created temperature profile on the substrate, according to illustrative embodiments.

FIG. 3a schematically illustrates a laterally varying temperature profile 310 of the polishing pad 202 for a situation in which the temperature zone 201B may have a temperature of approximately 40° C., while the central zone 201A and the peripheral zone 201C may have a temperature of approximately 20° C. Consequently, by positioning the center 250C within the zone 201B, an increased temperature, which may substantially correspond to the temperature of the central zone 201B, and thus the removal rate, may be obtained at the center of the substrate 250.

Figure 3B:
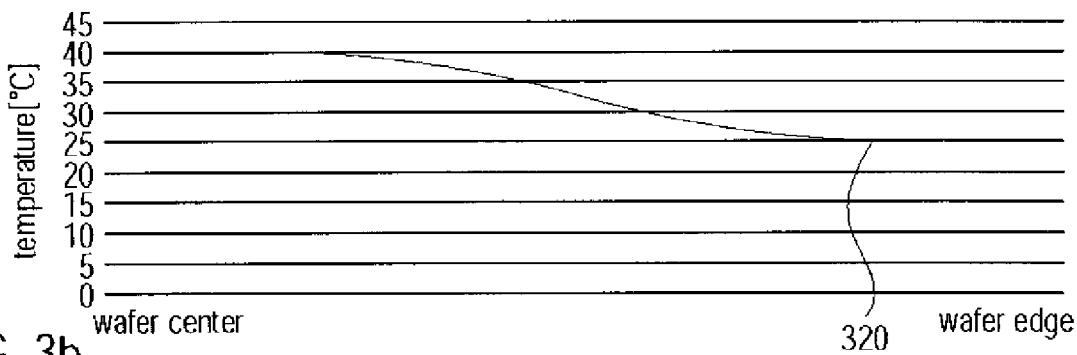

FIG. 3b schematically illustrates a respective temperature profile 320 laterally or radially varying across the substrate 250, i.e., the material 251. As illustrated, a temperature of substantially 40° C. corresponding to the temperature of the zone 201B may be obtained at the center 250C, which may gradually decrease and reach a value of approximately 25° C., which may be higher than the temperatures of the zones 201A, 201C, since, during rotation of the substrate 250, the peripheral portions may also come into contact with the "high temperature" zone 201B. As is evident from FIGS. 3a and 3b, the actual established temperature profile 320 of the substrate 250 may be controlled, for a given initial definition of the size and shape of zones 201A, 201B, 201C, by manipulating the relative position of the center 250C of the substrate 250 with respect to the temperature zones and, if required, by adjusting the temperatures of the zones 201A, 201B, 201C.

Figure 3C:
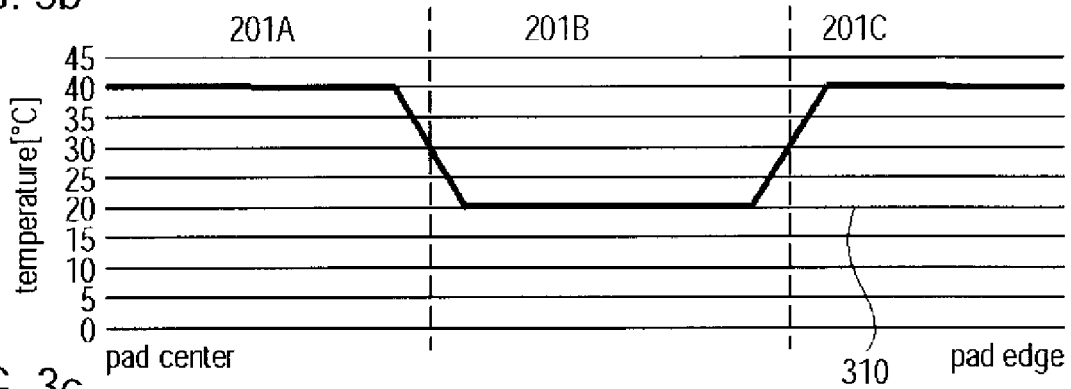
FIGS. 3c-3d schematically illustrate respective laterally varying temperature profiles of a polishing platen and a substrate, according to yet other illustrative embodiments.

FIG. 3c schematically illustrates the temperature profile 310 across the polishing pad 202 according to a further example in which the radial size of the zone 201B may be increased, while reducing the radial size of the peripheral zone 201C. Moreover, the temperature of the zone 201B is at approximately 20° C., while the central and the peripheral zones 201A, 201C are maintained at substantially 40° C.

Figure 3D:
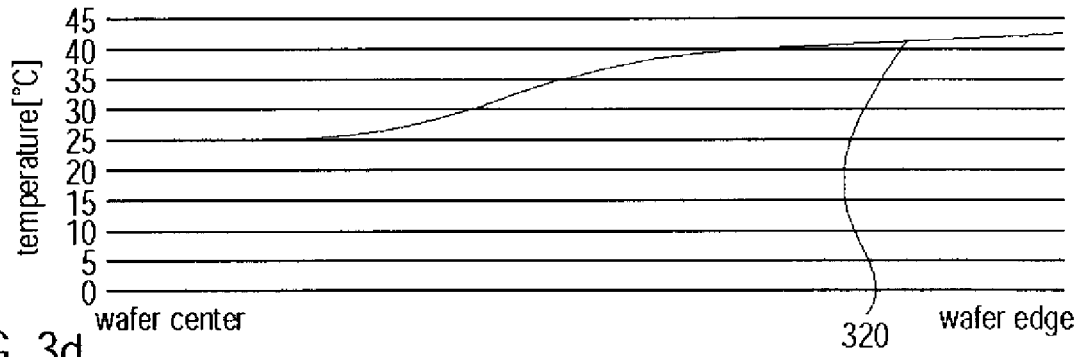

FIG. 3d schematically illustrates the respective temperature profile 320 across the substrate 250, when the center 250C thereof is positioned in the zone 201B. Thus, the center 250C may take on substantially the temperature of the zone 201B, i.e., approximately 20° C., while, with increasing radial distance, the temperature may increase due to contact of the peripheral areas of the substrate 250 with the zones 201A, 201C. Consequently, upon actually polishing the substrate 250, an increased removal rate may be obtained at the periphery of the substrate 250 due to the temperature dependent reaction rate of slurry materials and/or due to a temperature dependent electrochemical potential that may be established during an electrochemical polishing process.

It should be appreciated that the above illustrated examples are of illustrative nature only and that any other appropriate temperature profile 320 may be established by appropriately controlling the size, the shape, the temperature and the lateral position of the substrate 250, wherein one or more of these parameters may be kept constant, while one or more of these parameters may be used for adjusting the desired profile 320. For instance, based on pre-polishing measurement data or any other process related information, it may be known in advance that an increased removal rate may be required at the substrate periphery so that an appropriate profile for the temperature zones 201A, 201B, 201C may be established in advance, for instance, by providing a respectively prepared polishing platen 209, by appropriately adapting the size and configuration of the temperature adjustment unit 201 and the like. Moreover, an appropriate temperature for each of the zones may be selected in advance, wherein an appropriate "fine tuning" of the profile 320 on the substrate 250 may be accomplished by appropriately adjusting the radial position of the substrate 250 during the actual polishing process. Depending on the overall thermal response behavior of the temperature zones 201A, 201B, 201C, in other cases, the temperature may be varied in a dynamic manner, for example, between individual substrates or within the polishing process of a single substrate, possibly in combination with a variation of the radial position of the substrate 250, so as to obtain the desired temperature profile 320.

Furthermore, it should be appreciated that an efficient adjustment of a temperature gradient across the substrate 250 may also be accomplished on the basis of two temperature zones of different temperature or on the basis of four and more temperature zones, depending on the configuration of the tool 220 and the process requirements.

With reference to FIGS. 4a-4f, further embodiments will now be described in which varying configurations for temperature adjustment units may be discussed in order to establish an appropriate temperature profile across the polishing pad. It should be appreciated, however, that some or all of the concepts discussed herein with respect to providing temperature zones in a polishing platen of the polishing tool may also be applied to create respective temperature zones in the polishing head, thereby directly creating a temperature profile across the substrate to be treated.

Figure 4A:
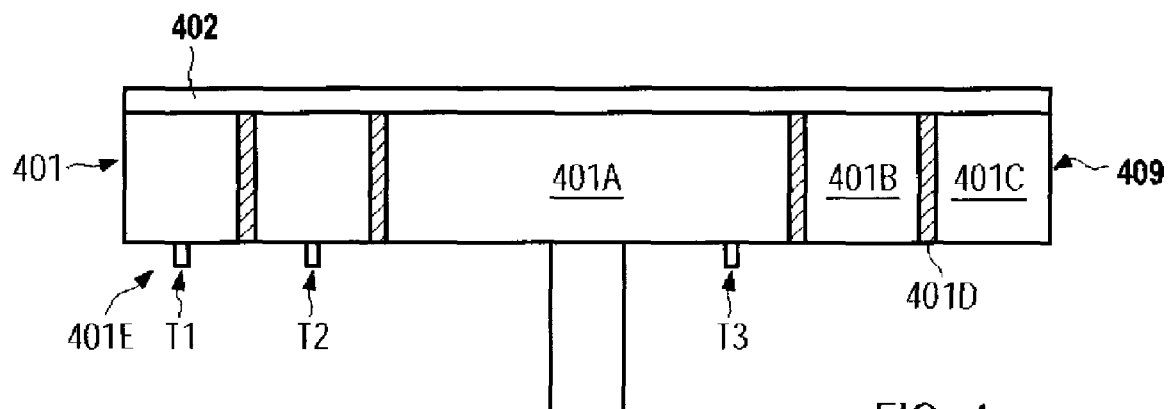
FIGS. 4a-4f schematically illustrate cross-sectional views and top views of a temperature adjustment unit for establishing a desired temperature profile in a polishing platen, according to further illustrative embodiments.

FIG. 4a schematically illustrates a cross-sectional view of a polishing platen 409, including a polishing pad 402. Furthermore, the platen 409 may comprise a temperature adjustment unit 401 including a plurality of heat reservoirs 401A, 401B, 401C having an appropriate size and shape to define the desired temperature zones, as previously explained. The respective reservoirs 401A, 401B, 401C may be thermally isolated from each other by appropriate separation walls 401D having a low thermal conductivity to reduce heat exchange between adjacent reservoirs 401A, 401B, 401C. Furthermore, the unit 401 may comprise respective terminals 401E for connecting thereto any appropriate heat supply sources for providing a heat transfer medium, such as liquid, gas and the like. Thus, the respective heat transfer media may be supplied with appropriate temperature T1, T2, T3 to the reservoirs 401A, 401B, 401C. In some illustrative embodiments, the heat capacity of the respective heat transfer medium and/or of the reservoirs 401A, 401B, 401C is moderately high so as to enable a substantially constant temperature over a certain time period despite the thermal "losses" dissipated via the polishing pad 402, thereby avoiding a continuous supply of heat transfer medium during operation of the platen 409. For example, a certain allowable range of temperature change may be determined in advance and the mode of operation of the polishing tool, including the platen 409, may be appropriately designed such that each of the temperatures of the reservoirs 401A, 401B, 401C may be maintained within the allowable range, for instance, by connecting the terminals 401E to the external sources on a regular basis.

Furthermore, in some illustrative embodiments, the isolation walls 401D may be configured such that a plurality of small reservoirs may be defined, wherein, upon removal of individual walls 401D or by providing a controllable connection between adjacent reservoirs, a convenient adaptation of the finally desired size of the reservoirs 401A, 401B, 401C may be realized. Thus, the platen 409 may be configured in advance with respect to the size and configuration of the reservoirs 401A, 401B, 401C by re-arranging the respective isolation walls 401D. In other illustrative embodiments, the platen 409 may comprise a manifold in combination with respective valve elements so that, by appropriately interconnecting appropriate small reservoirs 401A, 401B, 401C, a desired overall configuration for the respective temperature zones may be established. Thus, by appropriately interconnecting the respective individual reservoirs, an appropriate configuration may be obtained in a highly dynamic manner, wherein, after supplying the corresponding heat exchange media, a desired temperature profile across the platen 409 may be achieved.

Figure 4B:
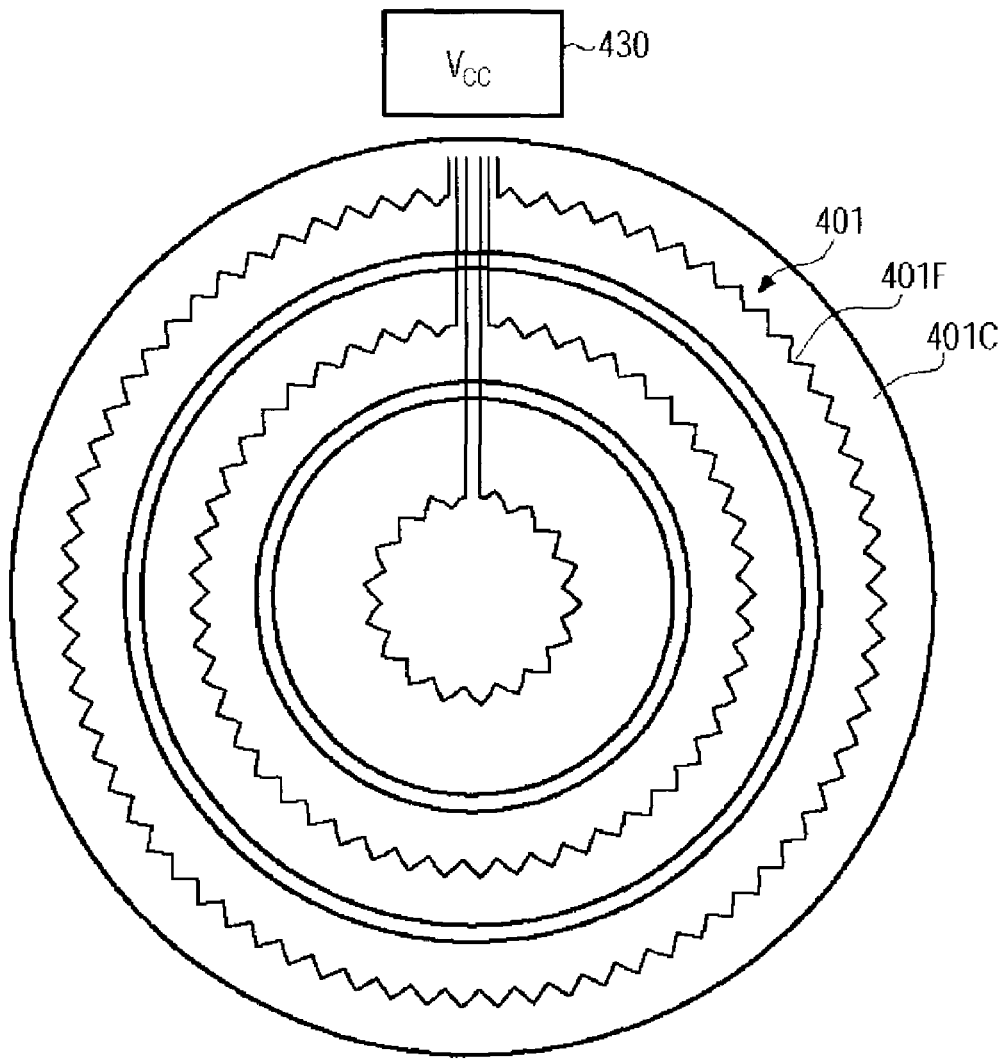

FIG. 4b schematically illustrates a top view of the platen 409 according to further illustrative embodiments. As shown, the temperature zones 401A, 401B, 401C of the temperature adjustment unit 401 may be defined by electrically driven heating elements 401F, possibly in combination with heat reservoirs as shown in FIG. 4a, to establish the desired temperature profile. It should be appreciated that the electrically driven heating elements 401F may not necessarily need to be located in the actual temperature zones 401A, 401B, 401C, but may, in other illustrative embodiments, be positioned at any appropriate location within the platen 409 to maintain a desired temperature for a specific heat exchange medium. The corresponding heat exchange medium may then be supplied to the associated reservoirs, as for instance shown in FIG. 4a, to maintain the temperature thereof at the desired level, while also providing a high degree of dynamic behavior with respect to the adaptation of the temperature profile across the pad 402. The electrically driven heating elements 401F may be connected to a power supply 430, which may be incorporated into the platen 409 such that it may be possible to receive energy while the platen 409 is in a stationary state and/or to receive energy during any operational phase, as will be described later on.

Figure 4C:
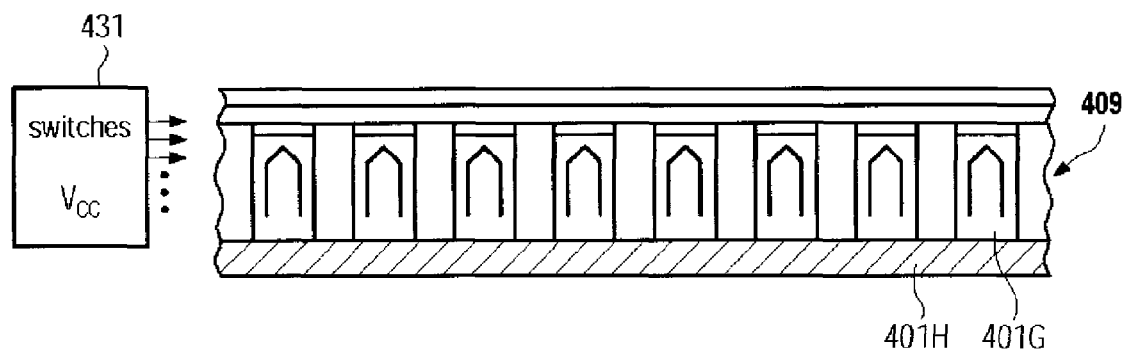

FIG. 4c schematically illustrates a cross-sectional view of the polishing platen 409 according to further illustrative embodiments, in which the temperature adjustment unit 401 may comprise, additionally or alternatively to the reservoirs 401A, 401B, 401C and/or the electrically driven elements 401F, a plurality of thermo-electric elements 401G, such as thermocouples, which may be connected to a power source and control unit 431. In one illustrative embodiment, the thermo-electric elements 401G may be connected to the control unit 431 such that the direction of current flow and the magnitude of the current may be controlled, allowing either to cool or heat the polishing pad 402. As is well known, thermo-electrical elements may allow the generation of a heat flow upon establishing a current flow, wherein, depending on the current flow direction, one side of the thermo-electric element may heat up, while the other side of the element may cool down. Consequently, a certain temperature gradient may be established across each of the elements 401G depending on the current flow direction and the magnitude of the current established by the control unit 431, thereby enabling a control of the overall temperature profile with a spatial resolution corresponding to the size of the individual elements 401G. In order to create an efficient temperature gradient across each of the thermo-electrical elements 401G, an appropriate heat reservoir 401H may be provided, for instance, using an appropriate heat sink that is thermally coupled to the environment, for instance by air cooling and the like, the efficiency of which may even be further enhanced during operation, that is, rotation of the polishing platen 409. Hence, a substantially constant temperature may be established at one end of the thermo-electric elements by the heat sink 401H, thereby providing a substantially stable reference temperature for the thermo-electric elements 401G. Thus, based on this reference temperature, the upper side of each of the elements 401G may be heated or cooled to establish the desired overall temperature profile.

Figure 4D:
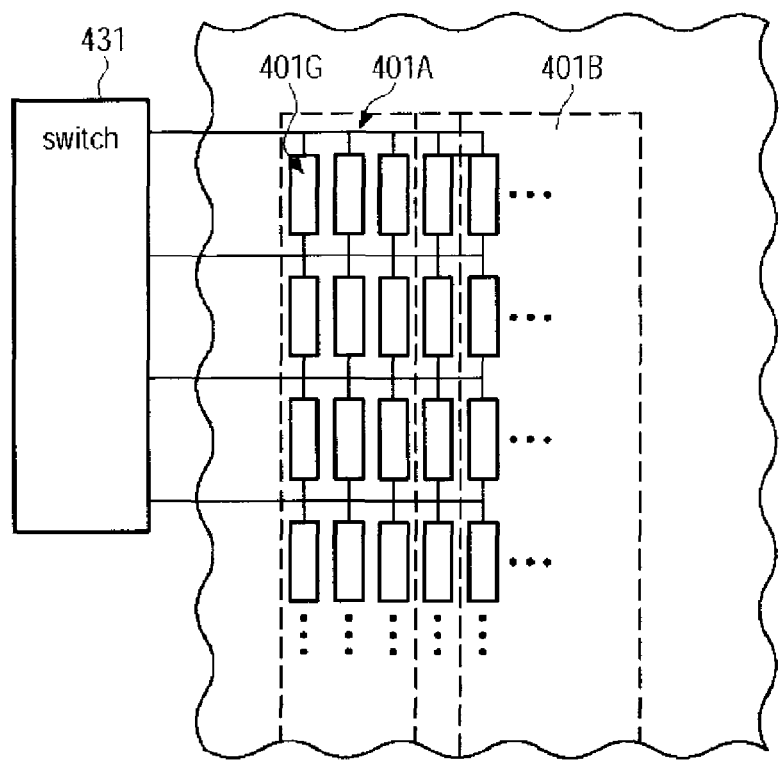

FIG. 4d schematically illustrates a top view of the platen 409 as shown in FIG. 4c. As illustrated, a plurality of the thermo-electrical elements 401G may be arranged in an array connected to the control unit 431. Thus, upon appropriately electrically connecting respective thermo-electric elements 401G, the desired temperature zones 401A, 401B may be obtained. Therefore, the size and shape of the temperature zones may be adapted in a highly dynamic manner by appropriately driving the elements 401G via the control unit 431, which may comprise appropriately designed switches, such as transistors and the like. It should further be appreciated that, by correspondingly controlling the current flow for a given temperature zone, also the temperature thereof may be adapted in a highly dynamic manner.

Figure 4E:
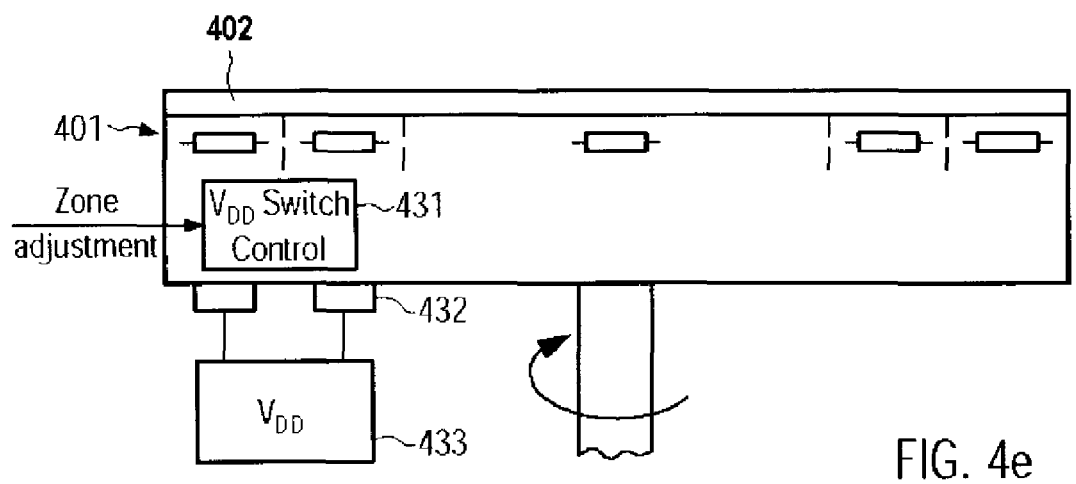

FIG. 4e schematically illustrates a cross-sectional view of the platen 409 including the temperature adjustment unit 401 according to further illustrative embodiments, in which the unit 401 may comprise electrically driven elements, such as thermoelectric elements, pumps or other components for circulating heat exchange media, valve elements and the like. As shown, the power supply and control unit 431 may be connected to appropriately designed electric terminals 432, for instance, provided as conductive rails or any other appropriate contact elements that enable a supply of electric energy even during operation of the polishing platen 409. Thus, power may be supplied from an external power supply 433 to operate the electrically driven elements and components in the unit 401. In some illustrative embodiments, external information may also be supplied to the unit 431, for instance with respect to controlling the temperature adjustment unit 401 to allow a highly dynamic behavior in response to the externally supplied information or a control signal. In other cases, appropriate control strategies may be implemented in the unit 431 or may be internally generated to obtain the desired control behavior.

Figure 4F:
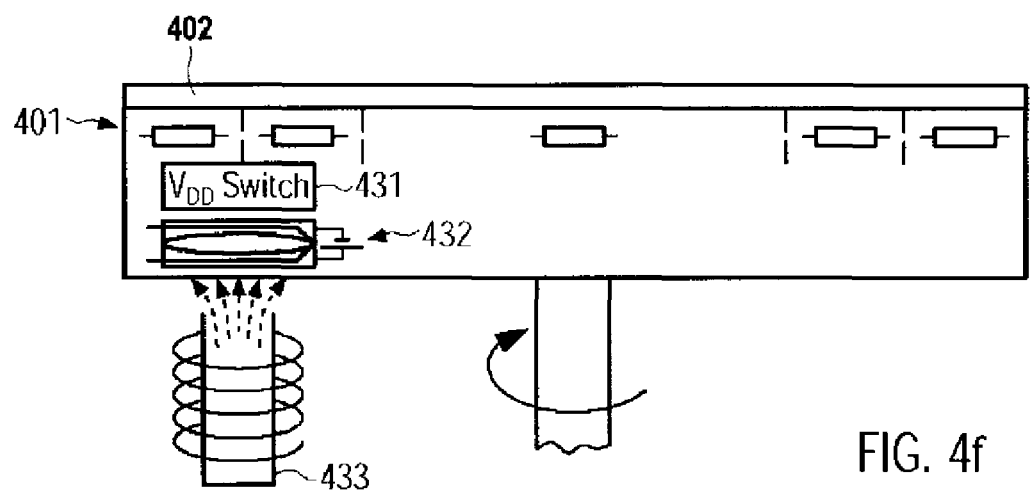

FIG. 4f schematically illustrates the platen 409 according to a further illustrative embodiment, in which energy may be supplied to the control unit 431 on the basis of a coupling station 432 and an external power supply 433 designed to inductively couple the energy into the coupling station 432. Hence, respective energy may be supplied irrespective of the operational status of the platen 409, while not requiring mechanical contact elements.

As a result, the subject matter disclosed herein provides polishing tools and respective methods for operating the same in which enhanced controllability may be achieved even in an operating regime in which moderately low down forces my have to be used. For example, for material removal in fragile material layers, for instance metallization layers of semiconductor devices including low-k dielectrics, the linear dependency of the removal rate from the relative speed and the down force may no longer be valid or may be in a range in which an efficient control for adjusting the radially varying removal profile may be difficult to be achieved. Thus, by using a temperature dependent removal mechanism, for instance in the form of a chemically highly reactive slurry material and/or the electrochemical potential during an electrochemical polishing process, an appropriate process parameter for adjusting a local removal rate across the substrate may be accomplished. In some illustrative embodiments, an appropriate temperature profile may be created across the substrate to be treated on the basis of defining respective temperature zones on a polishing pad, wherein parameters, such as size, shape, temperature and relative positioning of the substrate with respect to the temperature zones may be controlled. In other cases, respective temperature zones may be established in a polishing head, possibly in combination or alternatively to establishing different temperature zones in the polishing pad, thereby also enabling the establishment of a temperature dependent removal rate. Thus, the polishing process may be controlled on the basis of pre-polish and post-polish measurement data or other process related information, while the chemically highly reactive slurry material and/or the electrochemical effect may nevertheless provide a desired overall removal rate and thus reduced process time.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for polishing a substrate, the method comprising:
establishing a temperature profile in a material layer to be polished by determining a target temperature profile based on measurement data obtained from at least one of a previously polished substrate and one or more substrates to be polished;
adjusting said temperature profile in said material layer based on said target temperature profile, said temperature profile varying along at least one lateral direction of said material layer; and
polishing said material layer by using a temperature dependent chemical removal mechanism.

2. The method of claim 1, wherein said temperature dependent chemical removal mechanism comprises supplying a slurry having a temperature dependent chemical reaction rate.

3. The method of claim 1, wherein said temperature dependent chemical removal mechanism comprises supplying a slurry and applying a voltage to said material layer to be polished.

4. The method of claim 1, wherein establishing said temperature profile comprises creating two or more temperature zones in at least one of a polishing surface of a polishing pad and said substrate, said two or more temperature zones representing at least two different temperatures.

5. The method of claim 4, wherein said two or more temperature zones are created in said polishing surface of the polishing pad and establishing said temperature profile comprises controlling at least one of a position of said substrate with respect to said two or more temperature zones, a lateral size of said two or more temperature zones and a temperature of each of said two or more temperature zones.

6. The method of claim 5, wherein said polishing surface has a circular shape and said two or more temperature zones are substantially concentric areas.

7. The method of claim 6, wherein at least three temperature zones are provided and said substrate is positioned during at least a certain period of polishing so as to extend into three of said at least three temperature zones.

8. The method of claim 1, wherein said material layer is formed above a low k dielectric material of a metallization layer of a semiconductor device.

9. A method, comprising:
creating a temperature profile laterally across a polishing pad of a polishing tool;
determining a target removal rate of a material layer of a substrate based on at least one of pre-polish measurement data and post-polish measurement data of said material layer;
establishing a relative motion of said polishing pad and said substrate to each other when said material layer is in contact with said polishing pad;
removing at least a portion of said material layer by establishing a laterally varying removal rate in said material layer based on said temperature profile and said relative motion; and
controlling said laterally varying removal rate based on said target removal rate.

10. The method of claim 9, wherein creating said temperature profile comprises defining two or more temperature zones representing at least two different temperatures.

11. The method of claim 9, wherein removing at least a portion of said material layer comprises supplying a temperature sensitive slurry to said polishing pad.

12. The method of claim 9, wherein removing at least a portion of said material layer comprises applying a voltage between said material layer and said polishing pad.

13. The method of claim 10, wherein establishing said laterally varying removal rate comprises adjusting at least one of a temperature of each of said temperature zones, a lateral size of said two or more temperature zones and a relative position of said substrate with respect to said two or more temperature zones.

14. The method of claim 10, further comprising dynamically adapting said temperature profile by adjusting at least one of a size and a temperature of said two or more temperature zones.

15. The method of claim 1, wherein determining said target temperature profile is based on measurement data obtained from both a previously polished substrate and one or more substrates to be polished.

16. The method of claim 1, wherein polishing said material layer using said temperature profile based on said target temperature profile results in said polished material layer having a non-uniform thickness profile.

17. The method of claim 9, wherein determining said target removal rate is based on both pre-polish measurement data and post-polish measurement data.

18. The method of claim 9, wherein controlling said laterally varying removal rate based on said target removal rate results in a post-polished material layer having a non-uniform thickness profile.

* * * * *